US 6,604,971 B1

(12) United States Patent
Sun et al.

(10) Patent No.: US 6,604,971 B1
(45) Date of Patent: Aug. 12, 2003

(54) FABRICATION OF LED LAMPS BY CONTROLLED DEPOSITION OF A SUSPENSION MEDIA

(75) Inventors: Xiao-Dong Sun, Schenectady, NY (US); Robert J. Wojnarowski, Ballston Lake, NY (US); Raul E. Ayala, Clifton Park, NY (US); Thomas F. McNulty, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/562,774

(22) Filed: May 2, 2000

(51) Int. Cl.[7] .................... H01J 9/00; H01J 9/24
(52) U.S. Cl. .................... 445/24; 445/25; 445/14; 445/58; 427/64; 427/8
(58) Field of Search .................... 445/24, 25, 14, 445/58; 427/64, 8; 313/502, 503, 506, 512, 485

(56) References Cited

U.S. PATENT DOCUMENTS

| 3,706,885 | A | * | 12/1972 | Fister et al. ............. 250/459.1 |
|---|---|---|---|---|
| 4,081,764 | A | * | 3/1978 | Christmann et al. ........ 313/499 |
| 4,825,084 | A | * | 4/1989 | Braunlich et al. ........ 250/484.3 |
| 5,847,507 | A | | 12/1998 | Butterworth et al. ....... 313/512 |
| 5,922,395 | A | | 7/1999 | Koike et al. .................. 427/68 |
| 5,959,316 | A | | 9/1999 | Lowery ....................... 257/98 |
| 5,998,925 | A | | 12/1999 | Shimizu et al. ............. 313/503 |
| 6,066,861 | A | | 5/2000 | Höhn et al. ................... 257/99 |

* cited by examiner

Primary Examiner—Kenneth J. Ramsey
Assistant Examiner—Mariceli Santiago
(74) Attorney, Agent, or Firm—Fay, Sharpe, Fagan, Minnich & McKee, LLP

(57) ABSTRACT

A method of manufacturing an LED lamp includes dispersing color correction particles throughout a suspension media to a viscosity of substantially 2000 cP. In the case of correcting blue GaN LEDs to white light, the particles to be blended are phosphorus having a diameter of less than 20 microns. An LED die is mounted onto a stage and a nano-liter pipette is arranged such that an interface separation of approximately 1 millimeter is achieved between the tip of the pipette and the surface of the LED die. Once the relatively viscous suspension media covers the LED die, ultraviolet light is directed towards the suspension media to cure it. Heat is then applied to further cure the suspension media until solid as observed under a microscope.

5 Claims, 4 Drawing Sheets

FABRICATION OF LED LAMPS BY CONTROLLED DEPOSITION OF A SUSPENSION MEDIA

BACKGROUND OF THE INVENTION

The present invention relates to the manufacture of light emitting diode (LED) lamps. The invention finds particular application in conjunction with the controlled application of a volume of a suspension media into a header cup supporting the diode.

The phosphor deposition process is a key step in the consistent fabrication of new miniature solid-state lamps from GaN based LED technology. The current dimensions of GaN LED's die are (~300 micron) on a side, and are mounted in a shallow (~400 micron) header cup (~800 micron in diameter). Volumetrically, it only takes 500 nano-liter or less of phosphor carrier media, to fill the micro LED cups, in the lead-frame structures. This requires a phosphor deposition machine that is capable of dispensing phosphor media in volume smaller than 500 nano-liter with high precision. Since the light output from an LED lamp is highly sensitive to thickness variations in the deposited phosphor layer, small variations in the deposited volumes of phosphor materials, can cause dramatic differences in the color properties of the emitted light from the LED device.

Scanning electron microscope studies of commercially available LED lamps makes apparent that LED lamps are conventionally made in a multiple layered structure. Conventionally, an LED die is mounted to the header cup and covered with a layer of phosphor on the LED top surface, followed with a layer of silicone or epoxy overcoat.

The advantage of this method is that there exists more accurate liquid dispensing system for precise volume delivery of low viscosity suspensions. The disadvantage of this method is the lack of stability of the suspension towards sedimentation, resulting in premature settling of the phosphor particles prior to and during application (i.e., sedimentation stability).

In situations that require more than one layer to be used in suspension, additional difficulties arise such as segregation of different particles due to different densities, and new layer disruptions of the under layer by solvent action. In the situation that there is a phosphor particle size distribution, particle concentration gradients also may exist in the suspension. Both result in variations in the phosphor lay-down process, thus creating color variations.

The present invention contemplates an improved liquid dispensing system and method of manufacturing LEDs which overcomes the above-referenced problems and others.

BRIEF SUMMARY OF THE INVENTION

In accordance with one embodiment of the present invention, a method of fabricating an LED lamp includes mounting an LED onto a platform and positioning a nano-liter pipette such that an interface separation is provided between the surface of the LED and the tip of the pipette. A single drop of phosphor dispersed suspension media is then dispensed from the Pipette over the surface of the LED and then cured.

In accordance with another aspect of the present invention, the dispensing step includes urging a determined volume of the suspension media from the pipette, such that the single drop physically contacts at least a portion of the surface of the LED and the tip of the pipette simultaneously.

In accordance with another embodiment of the present invention, a light emitting semiconductor device is formed by a process including positioning a source of color adjusting fluid such that an interface separation is provided between the surface of a semiconductor and the fluid source. A single drop of a color adjusting fluid is dispensed from the source onto the surface of the semiconductor and then cured.

In accordance with another aspect of the present invention, the fluid is cured by directing ultraviolet rays and/or thermal energy toward the fluid.

In accordance with another aspect of the present invention, the color adjusting fluid includes a silicone polymer blended with phosphor particles.

In accordance with another aspect of the present invention, a microscope is focused on the interface separation to achieve a separation of 1 mm between the source and the semiconductor surface.

In accordance with another embodiment of the present invention, a method of manufacturing an LED lamp includes dispersing particles throughout a suspension media, and blending the media to a defined viscosity. The suspension media is then deposited over an LED die and cured.

In accordance with another aspect of the present invention, the depositing step includes urging a drop defining a determined volume of the suspension media from the source such that the drop physically contacts at least a portion of the surface of the LED die before separating from the source.

In accordance with another aspect of the present invention, the dispersing step includes mixing phosphor particles having a diameter of less than 20 microns throughout the suspension media.

In accordance with another aspect of the present invention, the blending step includes forming the particle dispersed suspension media to a viscosity substantially between 1500 cP and 2500 cP.

One advantage of the present invention resides in the ability to control phosphor particle segregation through the suspension media.

Another advantage of the present invention resides in minimizing the number of laydown steps required to make the lamp.

Yet another advantage of the present invention resides in the reduced cost of manufacture of LED lamps.

A further advantage of the present invention resides in the narrowing the light spectral distribution of LED lamps manufactured under the present invention.

Still further advantages of the invention will become apparent to those of ordinary skill in the art upon reading and understanding the following detailed description of the preferred embodiments.

BRIEF DESCRIPTION OF THE DRAWINGS

The invention may take physical form in certain parts and arrangements of parts, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
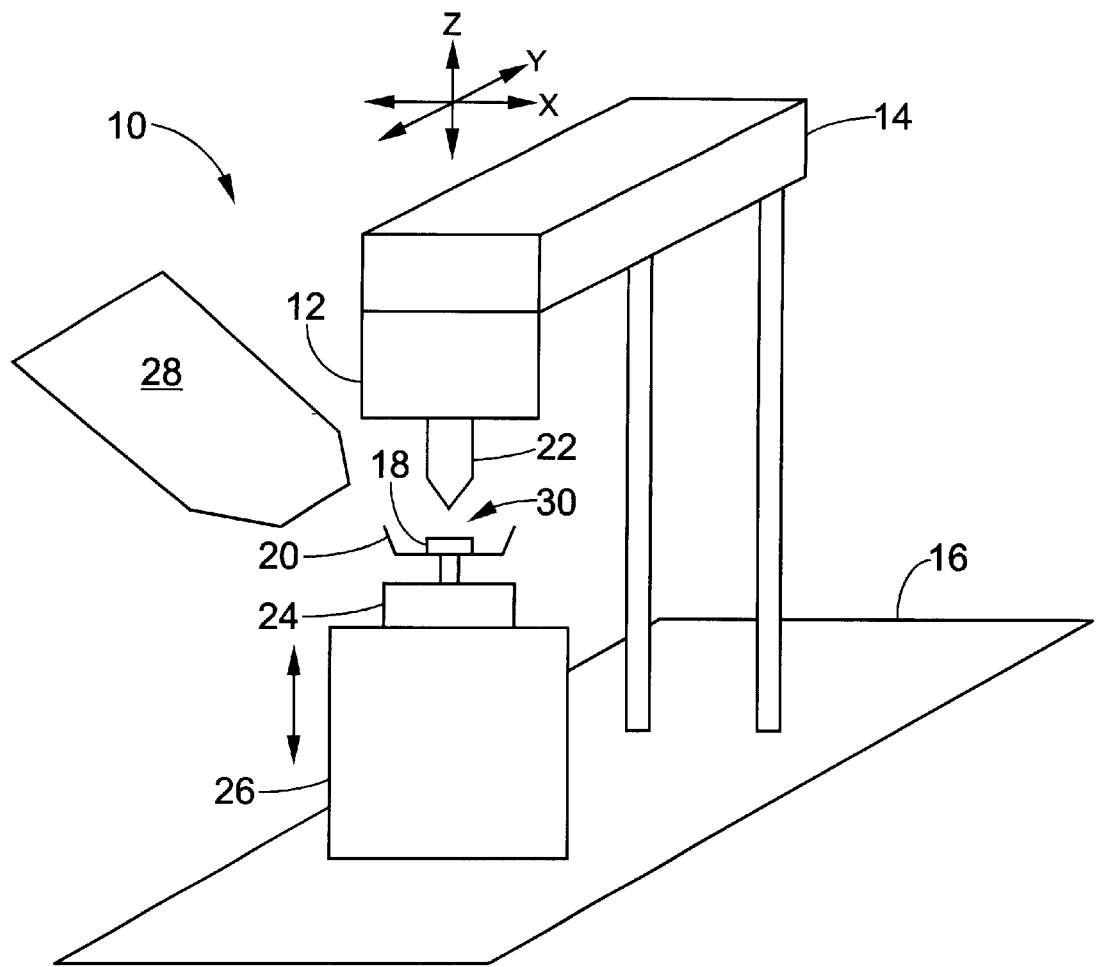
FIG. 1 is a diagrammatic illustration of a phosphor suspension dispensing system in accordance with the present invention.

Referring to FIG. 1, a dispensing facility 10 according to an embodiment of the present invention includes a semi-automated electronic micro-pipette 12 capable of liquid deposition of sub-micro-liter in volume is mounted on a X-Y-Z motion stage 14, which is further fixed on an optic table 16. An LED 18 is mounted in a cup 20 facing a dispensing tip 22 of the material application pipette 12. The cup 20 is disposed on a bed of conductive foam 24 which is further supported by a stage 26 movable along the z-axis. An optic microscope 28 is focused on the interface separation 30 between the dispensing tip 22 and the LED 18, which is controlled to be less than 1 millimeter during phosphor disposition. The interface separation is adjustable depending on characteristics of the suspension media including viscosity and volume delivered so that dispensed suspension media touches off the pipette when contact with the LED is made. This equipment allows accurate positioning while minimizing vibration and/or other external disturbances during phosphor deposition. Thus, the accuracy and precision of the phosphor lay-down process is increased.

In a preliminary test of this new phosphor dispensing system, a based YAG phosphor dispersion in a silicone polymer was deposited onto pre-weighted flat surfaces. The 10% volume of YAG/Silicone suspension has a viscosity around 2000 cP (viscosity of water is 1 cP), with particle size of the YAG phosphor ranging between 2 microns and 20 microns. This exemplary phosphor/silicone suspension is prepared by coating the phosphor powder with stearic acid to aid in particle wetting, before dispersing in the silicone/anisole fluid medium. The stearic acid dissolves easily in warm toluene. As an example, 25.0 g of YAG:Ce powder is mixed with 25.0 ml of the stearic acid/toluene solution in a 125 ml nalgene bottle. Those skilled in the art will recognize that the process can be extended to other phosphor powders as well. The resultant slurry is then mixed for 30 minutes on a ball mill with 25⅛" $ZrO_2$ grinding media. After 30 minutes of mixing, the toluene solution is extracted from the powder by vacuum filtering the slurry through #4 Whatman filter paper. The excess stearic acid (that doesn't chemisorb onto the powder surface) passes through the filter paper and is removed from the powder. After the powder is filtered, the powder is dried at 70° C. for 4 hours. The dried powder cake is removed from the filter, crushed, then used for suspension preparation.

Figure 2:
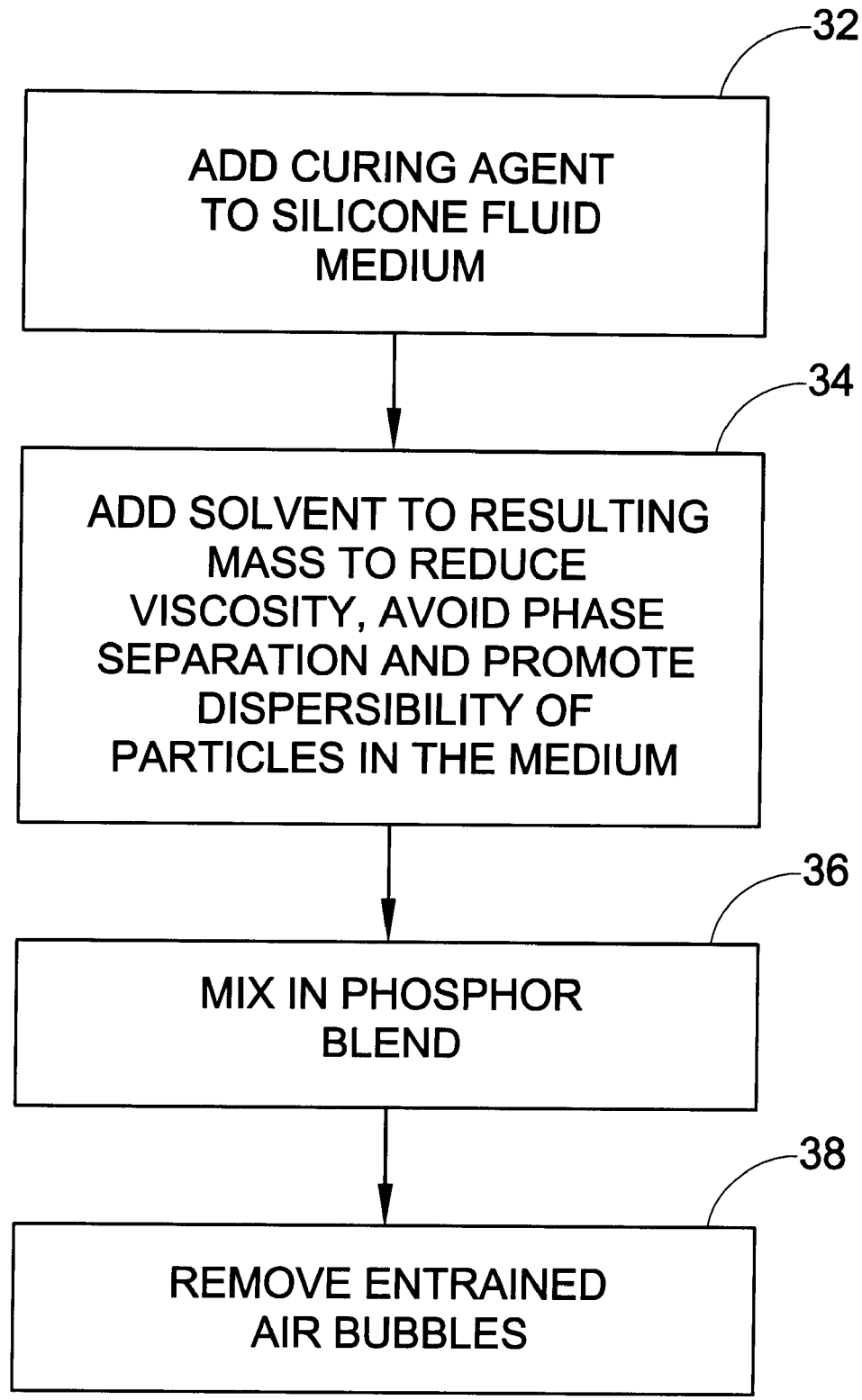
FIG. 2 is a flowchart of a phosphor suspension preparation method sufficient to practice the present invention.

Referring now to FIG. 2, an exemplary phosphor suspension prepration is shown in several steps. First, the silicone fluid medium is prepared by adding equal amounts by mass of XE-5844A and XE-5844B fluids which will cross-link and solidify during temperature curing, illustrated as step 32 in FIG. 2. After mixing of the two parts to promote intimate contact, a suitable low viscosity solvent such as anisole, or other organic liquid may be added to adjust the viscosity of the resulting mass, step 34. Suitability of the solvent is primarily determined by its ability to reduce viscosity of the resulting medium, its miscibility with the silicone fluid to avoid phase separation, and its polarity that promotes dispersibility of the powder particles. All three properties are preferably satisfied simultaneously. Anisole, as an example, is highly desirable because it has a low viscosity (less than 1 cP), it is a relatively polar solvent that is totally miscible in XE-5844 silicone fluid and, unlike the more polar alcohols (e.g., methanol, propanol, butanol), does not form a white milky emulsion when mixed with XE5844 silicone fluid. Viscosity plays an important role in the deposition or laydown step where control of the drop size and detachment from the dispenser tip during deposition determines the repeatability of the process. For instance, addition of 10% weight of anisole to XE5844 silicone fluid reduces viscosity by a factor of about 10.

Once the viscosity of the silicone fluid is adjusted to a desirable level, the stearic acid-coated phosphor is mixed with the silicone fluid by hand or other conventional means, step 36. To remove air bubbles entrained in the suspension during mixing, the suspension is subjected to vacuum degassing step 38. A typical laboratory vacuum pressure of −20 inches of mercury gauge for 30 to 60 minutes is usually sufficient. At that point, the phosphor suspension is ready to be deposited onto the LED die.

Setting the electronic micro-pipette 12 to 500 nL, a mean deposition volume of 445+/−68 nL was obtained (i.e., relative standard deviation is +−15%). The mean was close to the target (445 vs. 500 nL), but the distribution is not as tight as desired, due to the small dispensing volume and high viscosity of the solid particle suspension. The distribution was improved by reconfiguring the dispenser tip and dispensing mode of the dispenser as more fully discussed below. With this system, a 500 nano-liter silicone suspensions of 10% volume $(Y_xGd_1-x)_3Al_5O_{12}:Ce^{3+}$ (YGAG) was dispensed onto GaN blue LED mounted on gold header. The separation of dispenser tip and the LED top surface was controlled to be around 1 mm before the delivery of phosphor onto the die.

Figure 3:
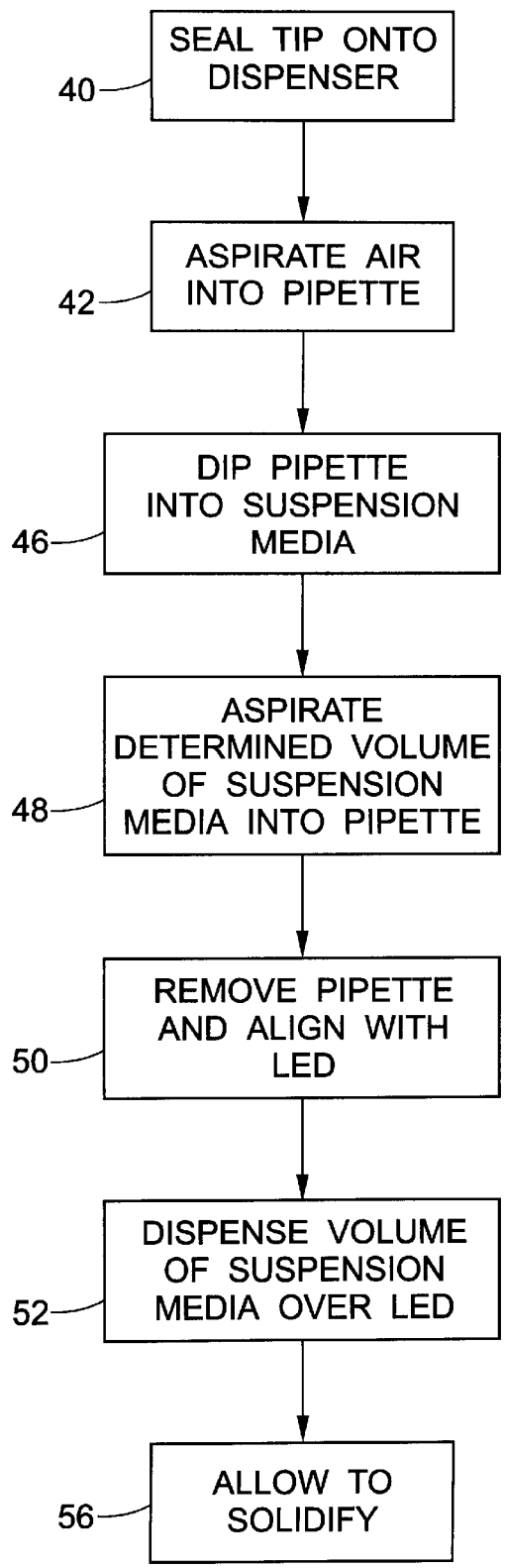
FIG. 3 is a flowchart of a deposition technique sufficient to practice the present invention.

With reference now to FIG. 3, an exemplary aspiration/deposition technique for the phosphor silicone suspension is shown. A single channel motorized microliter pipette 12 (FIG. 1), as is commercially available from Rainin Instrument Co., was selected. To make the dispenser suitable for accurate sub-microliter deposition of viscous solid suspensions, a special deposition mode was set on the dispenser, and the following aspiration/dispensing processes were developed to enhance the quality of deposition. A one-time plastic tip is disposed on the dispenser tip 22 using silicone vacuum grease, as provided in step 40. 5 microliters of air is then aspirated, step 42.

The pipette tip 22 is then dipped into the bulk of the phosphor/silicone suspension, step 46. 500 nanoliter (0.5 microliters) of the silicone suspension is then aspirated, and the tip is held in the suspension for about 10 seconds after the conclusion of aspiration, step 48. To ensure the accuracy of deposition, a slow aspiration mode is selected. On the Rainin Instrument Co. device, for example, it takes about 2.2 seconds to aspirate/dispense 5 micro liters of volume from the dispenser (the slowest mode), due to the high viscosity of the suspension. With anisole diluted phosphor suspension, the motor speed is increased correspondingly to improve the accuracy.

The pipette 22 is then pulled out, and exterior phosphor residue is cleaned from the tip. The LED device 18 is then moved into position, step 50. The motion fixtures on the dispenser, as shown in FIG. 1, allow full scale movement of the dispenser between the suspension reservoir and the LED device 18 over all dimensions, while minimizing the shaking/distortion of tip position during the phosphor lay-down process. Accurate positioning comprises both accurately aligning the LED chip center in the x-y plane with the dispensing tip, and along the z-axis, vertically controlling the interface separation 30 between the dispensing tip and the chip to be ~1 mm. The relative positioning of the tip and the LED is monitored under the microscope 28 for accuracy. Those skilled in the art will appreciate that the interface separation 30 may vary according to factors such as dispensed media viscosity, surface tension, volume and the like.

Once in place, a viscous droplet of silicone suspension is dispensed, and "touches-off" when it contacts the LED device, step 52. The dispensing is a "touch off" process due to the viscous nature of the suspension, i.e. the extruded phosphor droplet touches the LED, before separating from the dispensing tip 22. This process is also monitored under the optic microscope 28. Typically, the drop of suspension beads up as a non-spreading meniscus and eventually covers the entire LED chip and header cavity. After deposition, the LED is placed under a UV and IR irradiation lamp, with surface temperature of substantially 80° C. The silicone is cured for half an hour until solid, also as observed under the microscope, step 54.

A repeatability study on the deposition volume of sub-microliter phosphor silicone suspension was done. The phosphor loading is 15.45% in volume, which is representative of the phosphor silicone suspensions used in the LED lamp manufacturing process. A total of ten pre-weighted glass slides were used for statistic anlysis of volume variation. Each slide takes an average of 437 nanoliter such phosphor silicone suspension, and the volume was calculated from the net weight of suspension and the known suspension density. The standard deviation is about 9.67% the average volume.

Figure 4:
FIG. 4 is a grayscale photograph of a light emission from photonic device formed according to the present invention as seen against ambient light.
Figure 5:
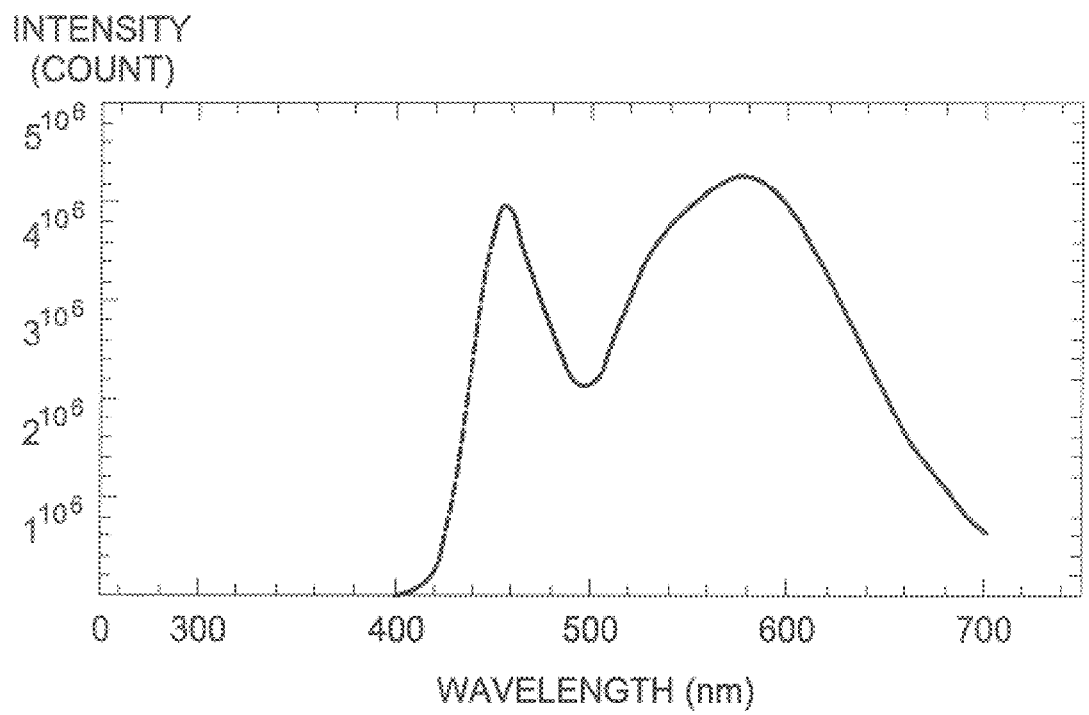
FIG. 5 is a plot of the emission spectrum of FIG. 4.

The fabricated LED lamp was pumped with 20 mA of DC current, and FIG. 4 illustrates its emission in ambient light. The emission 58 is bright white. The electric pumped LED was placed under a wavelength-calibrated spectrophotometer to measure its emission spectrum. FIG. 5 is a plot of this spectrum. From the emission spectrum, the color temperature was calculated to be 4717.6° dK, and the color coordinate was calculated to be (0.356, 0.373). Those skilled in the art will note that the emission color of this lamp is separated from the black body locus by only 0.01, indicative of superior color quality.

Compared to multi-layered deposition processes, the concept of a single deposition of phosphor/silicone has the advantage of better control of phosphor segregation, and it minimizes the number of lay-down steps in making the lamp. This desirably cuts the cost of manufacture and narrows the light spectral distribution.

There are many optimizations possible for color temperature and other light properties desired using a precision lay-down system as described. Precisely controlling the volume variance of the deposition system, for sub-microliter lay-down of high viscous suspension of polymers and phosphors, enables multi-phosphor dispersions as well. The ability to deposit a layer of phosphor and snap cure it in place enables a multi phosphor such as red green blue to produce optimal light colors for UV GaN LED lights as well. The phosphors may have different density materials in the polymer media. Any heat alone applied generally lowers the viscosity of the polymer and allows a settling out of a homogeneous suspension. This caused part to part variation, and causes a wide distribution of production lamps. The combination of UV light and heat produces unique properties in freezing the phosphors in a desired matrix.

Multi-layered phosphors or dyes and phosphor combinations may be applied using the same technology described in this invention. The red-green-blue phosphors may be applied as a deposition, or may be applied as single phosphor or dual phosphor and single phosphor layers as well, using this technology. This may be used to optimize the light extraction from the LED source of enhanced efficiency.

The invention has been described with reference to the preferred embodiments. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A method of fabricating an LED lamp including:

mounting an LED onto a stage positioning a nanoliter pipette such that an interface separation is provided between a surface of the LED and a tip of the pipette; and dispensing a single drop of a phosphor dispersed suspension media from the pipette over the surface of the LED.

2. The method as set forth in claim 1, further including:

curing the suspension media.

3. The method as set forth in claim 1, wherein the positioning step includes:

monitoring the interface separation while adjusting a relative position between the pipette and the LED surface to a determined relationship.

4. The method as set forth in claim 3, wherein the monitoring step includes:

focusing a microscope on the interface separation; and observing the interface separation while adjusting the relative position.

5. The method as set forth in claim 1, wherein the dispensing step includes:

urging a determined volume of the phosphor dispersed suspension media from the pipette, such that the single drop physically contacts at least a portion of the surface of the LED and the tip of the pipette simultaneously.

* * * * *